United States Patent [19]

Gilbert

[11] 4,357,637

[45] Nov. 2, 1982

[54] PREAMPLIFIER CIRCUIT

[75] Inventor: Ted B. Gilbert, Littleton, Colo.

[73] Assignee: Honeywell Inc., Minneapolis, Minn.

[21] Appl. No.: 288,098

[22] Filed: Jul. 29, 1981

[51] Int. Cl.³ .......................... G11B 5/45; G11B 5/02
[52] U.S. Cl. ........................................ 360/65; 360/67
[58] Field of Search ............................. 360/46, 65, 67

[56] References Cited

U.S. PATENT DOCUMENTS

| | | | |
|---|---|---|---|
| 3,465,321 | 9/1969 | Reisfeld | 360/67 |
| 4,110,798 | 8/1978 | Miller et al. | 360/65 |
| 4,159,489 | 6/1979 | Braitberg | 360/65 |
| 4,314,288 | 2/1982 | Gyi | 360/67 |

Primary Examiner—Vincent P. Canney
Attorney, Agent, or Firm—Lockwood D. Burton; Mitchell J. Halista

[57] ABSTRACT

A preamplifier for a reproduced signal in a magnetic record reproducing system includes a differential amplifier construction wherein the input stage thereof may be configured either as a differential cascode arrangement for minimum noise at a lower frequency range or as an emitter-follower for maximum input impedance at an upper frequency range. The construction allows the preamplifier to respond to very high frequencies, on the order of 4 MHz, without the introduction of an undesirable phase shift in the reproduced signal.

10 Claims, 1 Drawing Figure

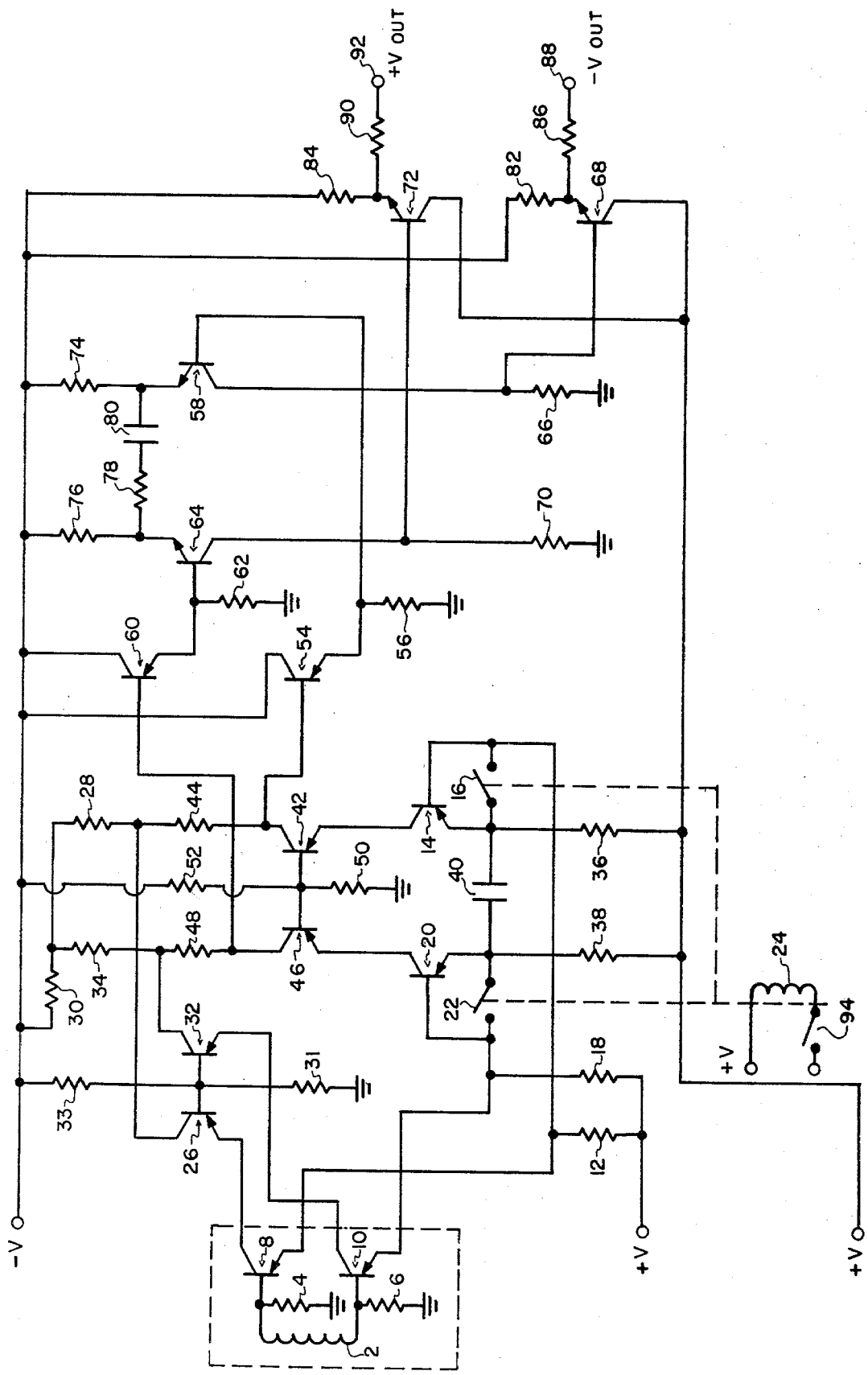

PREAMPLIFIER CIRCUIT

CROSS REFERENCE

Cross reference is made to Braitberg U.S. Pat. No. 4,159,489 for Magnetic Recording Reproducing System, assigned to the same assignee as the present invention, and incorporated by reference herein.

BACKGROUND OF THE INVENTION

The present invention relates to magnetic record apparatus. More particularly, it relates to a preamplifier means for a magnetic record reproducing system.

It is the objective of any record playback system to faithfully reproduce the signals which were impressed on the recording medium, free from distortions and superimposed spurious signals known as noise. Whereas previously, in the art of magnetic recording, the distortions and superimposed noise was due largely to the coating on the tape or to the inefficiency of the reproduce head, those problems have been overcome by the advancing technology and it is now found that the limitations to the quality reproduction of the recorded signals lies in the electronic amplification system. While the referenced Braitberg patent provided a marked improvement in the electronic amplification system, the upper frequency limit in that circuit was found to be about 2 MHz. It was found, however, that when an effort was made to push the frequency response beyond 2 MHz, there was a resulting phase shift of the reproduced signal relative to the recorded signal. In such high frequency situations wherein a high accuracy is required, the phase shift is an undesirable if not intolerable characteristic.

SUMMARY OF THE INVENTION

It is, accordingly, an object of the present invention to provide an improved amplifier circuit which obviates the foregoing shortcomings.

It is another object of the present invention to provide an improved magnetic record playback amplifier which features extended band width response characteristics without introducing a significant signal phase shift.

In accomplishing these and other objects, there has been provided, in accordance with the present invention, a preamplifier for a producted signal in a magnetic record reproducing system which includes a differential amplifier construction wherein the input stage thereof may be configured either as a differential cascode arrangement for minimum noise at a lower frequency range or as an upper frequency range. The construction allows the preamplifier to respond to very high frequencies, on the order of 4 MHz, without the introduction of an undesirable phase shift in the reproduced signal.

BRIEF DESCRIPTION OF THE DRAWINGS

A better understanding of the present invention may be had from the following detailed description when read in the light of the accompanying drawing, in which:

The single FIGURE is a schematic diagram of the preamplifier circuit embodying the present invention.

DETAILED DESCRIPTION

Referring now to the drawing in more detail, there is shown in the single FIGURE, a magnetic record transducer represented by the winding 2. A resistor 4 is connected between a first terminal of the winding 2 and ground. Similarly a resistor 6 is connected between the other terminal of the winding 2 and ground. The first mentioned terminal of the winding 2 is connected to the base of a transistor 8 while the other terminal of the winding 2 is connected to the base of a second transistor 10. The emitter of the transistor 8 is connected through a resistor 12 to a positive voltage supply source. The emitter of the transistor 8 is also connected to the base of a transistor 14 and, through a selectively operable switch 16, to the emitter of the transistor 14. Similarly, the emitter of the transistor 10 is connected through a resistor 18 to the positive voltage supply source. The emitter of the transistor 10 is also connected to the base of the transistor 20 and, through a selectively operable switch 22, to the emitter of the transistor 20. The switches 16 and 22 are, or may be relay contacts simultaneously operated by a selective energization of a relay coil 24. The collector of the transistor 8 is connected, through the emitter-collector path of a transistor 26 and the serial connection of a resistor 28 and a resistor 30, to a negative voltage supply line. The collector of the transistor 10 is connected, through the emitter-collector path of the transistor 32 and the serial connection of a resistor 34 and the resistor 30, to the negative voltage supply line. The base of the transistor 26 and the base of the transistor 32 are connected together and through a resistor 31 to ground. The junction between the bases of the transistors 26 and 32 is also connected through a resistor 33 to the negative voltage supply line.

The emitter of the transistor 14 is connected through a resistor 36 to a positive voltage supply line. Similarly, the emitter of the transistor 20 is connected through a resistor 38 to that positive voltage supply line. A capacitor 40 is connected directly between the emitter of the transistor 14 and the emitter of the transistor 20.

The transistor 14 is connected in cascode relationship with a transistor 42. That is, the collector of the transistor 14 is connected directly to the emitter of the transistor 42 while the collector of the transistor 42 is connected through a resistor 44 and the resistors 28 and 30 to the negative voltage supply line. Similarly the transistor 20 is connected in cascode relationship with a transistor 46, the collector of the transistor 20 being connected through the emitter collector path of the transistor 46 and, through a resistor 48, the resistor 34 and the resistor 30, to the negative voltage supply line. The bases of the two transistors 42 and 46 are connected directly together and, through a resistor 50, to ground. The junction between the bases of the transistors 42 and 46 is also connected through a resistor 52 to the negative voltage supply line.

The collector of the transistor 42 is connected to the base input of an emitter follower transistor 54 the collector of which is connected to the negative voltage supply line while the emitter is connected, first, through a resistor 56 to ground, and to the base input of a transistor 58. In a like manner, the collector of the transistor 46 is connected to the base of an emitter-follower transistor 60, the emitter of which is connected through a resistor 62 to ground. The emitter of the transistor 62 is also connected directly to the base of a transistor 64. The collectors of the transistors 54 and 60 are connected directly to the negative voltage supply line.

The collector of the transistor 58 is connected through a resistor 66 to ground. The collector of the transistor 58 is also connected to the base of an output driver transistor 68. The collector of the transistor 64 is connected through a resistor 70 to ground. The collector of the transistor 64 is also connected to the base of an output driver transistor 72. The emitter of the transistor 58 is connected through a resistor 74 to the negative voltage supply line. The emitter of the transistor 64 is connected through a resistor 76 to the negative voltage supply line. A series connection of a resistor 78 and a capacitor 80 are connected directly between the emitters of the transistors 64 and 58. The emitter of the transistor 68 is connected through a resistor 82 to the negative voltage supply line. Similarly, the emitter of the transistor 72 is connected through a resistor 84 to the negative voltage supply line. The emitter of the transistor 68 is connected through a coupling resistor 86 to a first output terminal 88 while the emitter of the transistor 72 is connected through a coupling resistor 90 to the second output terminal 92.

In operation, the signals recorded on a magnetic tape record (not shown) are detected by the transducer 2 and applied as input signals to the base electrodes of the transistors 8 and 10 comprising a first stage differential amplifier. As was mentioned hereinbefore, it is highly desirable to provide for signals in the higher frequency range, a relatively high input impedance at the transistors 8 and 10. That high input impedance is accomplished, in accordance with the present invention, with the switches 16 and 22 open as illustrated in the drawing. With the switches 16 and 22 open, the transistors 8 and 10 are connected in an emitter-follower configuration a feature of which is a high input impedance. With the transistors 8 and 10 configured as emitter followers, the transistors 26 and 32 provide a bias voltage for the transistors 8 and 10. The current through the transistors 8 and 10 is drawn, respectively, through the resistors 12 and 18 from the positive voltage supply source. The output signal from the emitter of the transistor 8 is applied to the base of the transistor 14 while the output signal from the emitter of the transistor 10 is applied to the base of the transistor 20.

In this configuration, that is with the switches 16 and 20 open, the transistors 14, 42, 20, and 46 are connected in a differential cascode configuration and comprise an intermediate stage differential amplifier. Thus the output signals from the transistors 8 and 10 are applied differentially to the inputs of the differential cascode amplifier comprising the transistors 14, 20, 42, and 46. The differential output signals from the cascode amplifier, taken from the collectors of the transistors 42 and 46, respectively, are applied to the base electrodes of the two emitter-follower amplifiers 54 and 60. The output signals from these two emitter followers 54 and 60 are applied, respectively, differentially to the inputs of the output differential amplifier comprising the transistors 58 and 64. The differential output signals from the transistors 58 and 64 are applied, respectively, to the output driver transistors 68 and 72 respectively and thence to the output terminals 88 and 92. Thus configured, the preamplifier circuit is capable of accommodating input signals in a higher frequency range. In an exemplary embodiment of the present invention, the higher frequency range comprised signals from between 500 KHz and 4 MHz.

At a lower frequency range, that is, for example, up to about 500 KHz, a lower input impedance to the transistors 8 and 10 together with a higher current flow therethrough is desirable in order to provide an acceptable signal-to-noise ratio at the lower frequencies. That desideratum is accomplished in the present invention by changing the configuration of the transistors 8 and 10. At the lower frequency range as set forth, the switches 16 and 22 are closed. With these switches 16 and 22 closed, the intermediate stage cascode differential amplifier comprising transistors 14, 20, 42 and 46 is effectively biased to cut off. The capacitor 40 is then connected directly between the emitters of the two transistors 8 and 10. The emitter current for the transistors 8 and 10 is now drawn not only through the resistors 12 and 18 respectively but also through the resistors 36 and 38. In the exemplary embodiment of the present invention, the resistors 12 and 18 had a resistance value of substantially 20 K-ohms while the resistors 36 and 38 had a resistance value of about 6.65 K-ohms this results in a significantly reduced emitter resistance and consequently a significantly higher (on the order of three times) current through the transistors 8 and 10 respectively. Also it may be seen that with the differential cascode amplifier comprised of the transistors 14, 20, 42, and 46 effectively biased to cutoff, the transistors 8 and 10 now appear as the lower pair of the transistors in a cascode connected relationship to the transistors 26 and 32 respectively. In this configuration the transistors 8 and 10 together with the associated transistors 26 and 32 comprise a first stage differential cascode input amplifier the output of which is applied to the input of the emitter-follower transistors 54 and 60, thence on to the output terminals 88 and 92, as before.

In high performance magnetic recording apparatus of the type to which the present circuit is applicable, are adapted to be operated at any of a number of different linear speeds for the recording tape. For example, the tape may be driven at any of eight or more different speeds varying from 15/16 of an inch per second to 240 inches per second. It is apparent that the higher frequencies would be those experienced and accommodated at the higher linear velocities of the tape. The switches 16 and 22 are, in the preferred embodiment, relay contacts actuated by the relay coil 24. In accordance with an embodiment of the present invention, the energization of the relay coil 24 is coordinated with the actuation of a speed selection switching mechanism for the tape drive system (not shown). Such coordination with the driving mechanism, is represented by a switch 94 in the energization circuit of the relay coil 24. In a preferred embodiment, the switch 94 is open, deenergizing the coil 24. This in turn allows the switch contacts 16 and 22 to be open whenever either of the two top speeds for the driving of the tape are selected. For the lower speed of the tape, the switch 94 will be closed, energizing the winding 24 and closing the two contacts 16 and 24. Thus, during high-speed, high-frequency operation of the tape system, the input transistors 8 and 10 are configured as emitter-followers feeding into a differential cascode amplifier comprised of the transistors 14, 20, 42, and 46. During low-speed, lower-frequency operation, the input transistors 8 and 10 are configured as the lower pair of the transistors of a differential cascode amplifier comprised of the transistors 8, 10, 26, and 32. With the input transistors 8 and 10 configured as a cascode amplifier, the input impedance is lower, the emitter collector current is higher, and the signal-to-noise ratio is higher. With the input transistors 8 and 10 configured as emitter follower amplifiers feeding into the input of the intermediate stage differential cascode amplifier comprised of the transistors 14, 20, 42, and 46, the input impedance of the circuit is very high to match the high impedance of the conductive transducer at the higher frequencies.

In the referenced Braitberg patent, there was a frequency sensitive choke in the input circuit. That frequency sensitive choke effected a change in the input characteristic of the amplifier thereshown. However that frequency sensitive choke introduced a limitation to the upper range of frequencies in that, being frequency sensitive it introduced a phase shift in the response characteristic of the transducer amplifier combination. In the amplifier embodying the present invention, there is no such frequency sensitive choke and consequently no significant phase shift in the response characteristic of the transducer and amplifier combination. The capacitor 40 connected between the emitters of the transistors 14 and 20 in one mode of operation and between the emitters of the transistors 8 and 10 in the other mode of operation renders the circuits AC coupled with any residual DC components being biased out across the capacitors and the differential amplification arrangement. Further, the differential amplifier combination provides a high level of low-frequency common-mode rejection for spurious signals which may be introduced into the system by way of the power supply or the like.

Thus there has been provided, in accordance with the present invention, an improved preamplifier circuit for magnetic record reproducing apparatus which is characterized by a wide frequency response characteristic without introducing a phase shift component in a resulting reproduced signal.

The embodiments of the invention in which an exclusive property or privilege is claimed are defined as follows:

1. In a magnetic record system wherein means are provided for selectively driving the record member at any of a number of different speeds, and having a playback transducer, a wide frequency band preamplifier, said preamplifier comprising:
- a first stage differential amplifier having input terminals connected to said transducer, said first stage amplifier being selectively configured in either of two operational modes;
- in a first said operational mode, said first stage amplifier being configured in a differential cascode amplifier;
- an output stage differential amplifier, said first stage differential cascode amplifier, in said first operational mode having an output connected as differential input to said output stage differential amplifier,
- in a second said operational mode, said first stage amplifier being configured as a differential emitter-follower amplifier; and
- an intermediate stage differential cascode amplifier, in said first operational mode, said intermediate stage cascode amplifier being biased to cut-off, in said second operational mode, said emitter-follower amplifier having a differential output connected as input to said intermediate stage differential cascode amplifier;
- said intermediate stage differential cascode amplifier, in said second operational mode, having an output connected as input to said output stage differential amplifier.

2. A preamplifier as set forth in claim 1 and including switch means operatively connected in the input circuit of said intermediate stage differential cascode amplifier, said switch means being selectively operable to effect the selective configuring of said first stage differential amplifier.

3. A preamplifier as set forth in claim 2 wherein said intermediate stage differential amplifier includes a lower pair of transistors and an upper pair of transistors, said lower pair of transistors being connected, respectively, in cascode relation with said upper pair of transistors, said lower pair of transistors each having an emitter electrode and a base electrode, said base electrodes being connected respectively, to the differential output of said first stage differential amplifier, said switch means including a first and a second switch member connected, respectively, selectively to provide a short-circuit between said base and emitter electrode of said lower pair of transistors.

4. A preamplifier as set forth in claim 3 wherein said first stage differential amplifier includes a first pair of transistors each having a base, an emitter and a collector electrode, and a second pair of transistors each having a base, an emitter and a collector electrodes, and a second pair of transistors each having a base, an emitter and a collector electrodes,
- said base electrodes of said first pair of transistors being connected, respectively, as input terminals, to said transducer,
- said collector electrodes of said first pair of transistors being connected, respectively, directly to said emitter electrodes of said second pair of transistors, said collector electrodes of said second pair of transistors being connected to a negative voltage supply means, and
- said emitter electrodes of said first pair of transistors being connected, respectively, to said base electrodes of said lower pair of transistors of said intermediate stage differential amplifier, and, respectively through first resistance means to a positive voltage supply means.

5. A preamplifier as set forth in claim 4 and further including a capacitor directly connected between said emitter electrodes of said lower pair of transistors of said intermediate stage differential amplifier.

6. A preamplifier as set forth in claim 5 wherein in said first operational mode, said capacitor is connected by the closure of said switch means, directly between said emitter electrodes of said first pair of transistors of said first stage differential amplifier.

7. A preamplifier as set forth in claim 6 wherein said emitters of said lower pair of transistors of said intermediate stage differential amplifier are, respectively, connected through second resistance means to a positive supply means.

8. A preamplifier as set forth in claim 7 wherein, in said first operational mode, said emitters of said first pair of transistors of said first stage differential amplifier are further connected, respectively, by said switch means, through said second resistance means to said positive voltage supply means.

9. A preamplifier as set forth in claim 8 wherein said switch means is selectively operable to switch said preamplifier from said first operational mode to said second operational mode coordinately with the selection of speeds of driving said record member where at the upper range of signal frequencies are accommodated.

10. A preamplifier as set forth in claim 9 wherein said switch means is selectively operable to switch said preamplifier from said first operational mode to said second operational mode for signal frequencies in the range from 500 KHz to 4 MHz.

* * * * *